US008736033B1

(12) United States Patent
Chuo et al.

(10) Patent No.: US 8,736,033 B1

(45) Date of Patent: May 27, 2014

(54) EMBEDDED ELECTRONIC DEVICE PACKAGE STRUCTURE

(71) Applicant: Unimicron Technology Corp., Taoyuan (TW)

(72) Inventors: Yu-Chen Chuo, New Taipei (TW); Wei-Ming Cheng, Kaohsiung (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 13/798,116

(22) Filed: Mar. 13, 2013

(51) Int. Cl.
*H01L 23/60* (2006.01)

(52) U.S. Cl.
USPC ................... 257/659; 257/660; 257/E23.114; 257/E23.115; 257/E23.145; 257/E23.178; 361/761; 361/816; 361/818

(58) Field of Classification Search
USPC .................. 257/659, 660, E23.114, E23.115, 257/E23.145, E23.178; 361/761, 816, 818
See application file for complete search history.

(56) References Cited

U.S. PATENT DOCUMENTS

| | | | | |
|---|---|---|---|---|
| 8,432,022 | B1 * | 4/2013 | Huemoeller et al. | 257/659 |
| 2007/0001286 | A1 * | 1/2007 | Chiu et al. | 257/700 |
| 2010/0019374 | A1 * | 1/2010 | Hundt | 257/693 |
| 2010/0159647 | A1 * | 6/2010 | Ito et al. | 438/124 |
| 2010/0301474 | A1 * | 12/2010 | Yang | 257/737 |

FOREIGN PATENT DOCUMENTS

| | | |
|---|---|---|
| TW | 200841815 | 10/2008 |
| TW | 201003870 | 1/2010 |

* cited by examiner

*Primary Examiner* — Peniel M Gumedzoe

(74) *Attorney, Agent, or Firm* — Jianq Chyun IP Office

(57) ABSTRACT

An embedded-electronic-device package includes a core layer, an electronic device, a first dielectric layer, a second dielectric layer, a shielding-metal layer and conductive vias. The core layer includes a first surface, a second surface opposite to the second surface and a cavity penetrating the core layer. The electronic device is disposed in the cavity including an inner surface. The first dielectric layer disposed on the first surface is filled in part of the cavity and covers part of the electronic device. The second dielectric layer disposed on the second surface is filled in rest of the cavity, covers rest of the electronic device. The first and second dielectric layers cover the electronic device. The shielding-metal layer covers the inner surface. The conductive vias are respectively disposed in the first and second dielectric layers and extended respectively from outer surfaces of the first and second dielectric layers to the shielding-metal layer.

10 Claims, 1 Drawing Sheet

EMBEDDED ELECTRONIC DEVICE PACKAGE STRUCTURE

BACKGROUND OF THE INVENTION

1. Field of the Invention

The present invention relates to a package structure, in particular, to an embedded electronic device package structure.

2. Description of Related Art

The complication of semiconductor devices has been increased, and at least part of the reasons is due to user's demands for increasing processing speed and decreasing the sizes of the devices. Although the advantages of increasing processing speed and decreasing sizes of the devices are significant, it also causes property issue of the semiconductor device. In particular, higher clock speed may increase the frequency of converting signal level, such that the electromagnetic emission with higher frequency or shorter wavelength is increased. Electromagnetic emission can be radiated out from a source semiconductor device and emitted into a neighboring semiconductor device. If the electromagnetic emission emitting toward the neighboring semiconductor device is strong enough, the electromagnetic emission may affect operation of the (neighboring) semiconductor device. This phenomenon sometimes is called electromagnetic interference (EMI). Semiconductor devices with smaller size suffer from EMI issue more seriously, because the semiconductor devices (with smaller sizes) are disposed in an electronic system with higher density, such that the neighboring semiconductor devices receive stronger and unwanted electromagnetic emission.

One way to diminish the electromagnetic interference is to shield one set of semiconductor devices in the semiconductor device package. In particular, by disposing grounding conductive casing or conductive housing at the outside of the package structure, shielding effect is achieved. When the electromagnetic emission radiating from the inside of the package structure toward the inner surface of the casing, at least part of the electromagnetic emission is shorted, so as to diminish the strength of the electromagnetic emission which is capable of penetrating the casing and effects the operation of the neighboring semiconductor devices. Similarly, when the electromagnetic emission radiates from the neighboring semiconductor device toward the outer surface of the casing, the similar shorted situation happens, so as to diminish the electromagnetic interference affecting the semiconductor devices in the package structure.

However, even though the conductive casing may diminish the electromagnetic interference, there are a lot of disadvantages in using the conductive casing, for example, the casing generally is fixed at the outside of the semiconductor device package by adhesive paste, and because the stickiness of the adhesive paste may decrease due to temperature, humidity and other environmental factors, the casing may easily peel off or fall off. Moreover, the size and the shape of the casing need to correspond to the size and the shape of the package structure, thus, different sizes and shapes of semiconductor device packages need to go with different casings to contain different package structures. This would further increase production cost and time. More importantly, the casing covering the outside of the semiconductor device would increase the volume of the package structure, so the package volume can not be effectively decreased, and this type of casing can not be applied to embedded electronic device package structure with higher package density, which is against the market demands for light, thin, short, small, high density, and function-integrated electronic products.

SUMMARY OF THE INVENTION

The present invention is directed to an embedded electronic device package structure, which the volume thereof is small and has electromagnet shielding function.

The present invention provides an embedded electronic device package structure including a core layer, an electronic device, a first dielectric layer, a second dielectric layer, a shielding metal layer and a plurality of first conductive vias. The core layer includes a first surface, a second surface opposite to the first surface and a cavity penetrating through the core layer. The electronic device is disposed in the cavity. The cavity includes an inner surface facing the electronic device. The first dielectric layer disposed on the first surface is filled in part of the cavity, and covers one side of the electronic device. The second dielectric layer disposed on the second surface is filled in the rest of the cavity, and covers another side of the electronic device. The first dielectric layer and the second dielectric layer fully cover the electronic device. The shielding metal layer at least covers the inner surface of the core layer. The first conductive vias are respectively disposed in the first dielectric layer and the second dielectric layer and extended respectively from outer surfaces of the first dielectric layer and the second dielectric layer to the shielding metal layer. According to an embodiment of the present invention, the shielding metal layer is extended from the inner surface to part of the first surface and the second surface. The first conductive vias are respectively extended from the outer surfaces of the first dielectric layer and the second dielectric layer to the shielding metal layer located on the first surface and the second surface.

According to an embodiment of the present invention, the embedded electronic device package structure further includes a plurality of conductive materials respectively filled in the first conductive vias.

According to an embodiment of the present invention, the first conductive vias include laser vias.

According to an embodiment of the present invention, the embedded electronic device package structure further includes a plurality of second conductive vias. The electronic device further includes a plurality of pads facing the second dielectric layer. The second conductive vias are extended from the second dielectric layer to the pads.

According to an embodiment of the present invention, the embedded electronic device package structure further includes a plurality of conductive materials respectively filled in the second conductive vias.

According to an embodiment of the present invention, the second conductive vias include laser vias.

According to an embodiment of the present invention, the embedded electronic device package structure further includes an adhesive layer filled between the pads.

According to an embodiment of the present invention, the electronic device includes a semiconductor chip.

According to an embodiment of the present invention, the material of the first dielectric layer and the second dielectric layer includes prepreg (PP).

Based on the description above, in the embedded electronic device package structure of the present invention, the electronic device is disposed in the cavity penetrating through the core layer, and the inner surface of the cavity are covered with a shielding metal layer. Also, the conductive vias are configured to connect the shielding metal layer to the outer surfaces of the first dielectric layer and the second dielectric layer. Accordingly, the shielding metal layer connected to the conductive vias not only may be the path of electrical connection, but also provide the electronic device with the function of electromagnetic shielding, and the conductive vias further extend the effect of electromagnetic shielding. Thus, the embedded electronic device package structure of the present invention takes advantage of the existing space and structure in the package structure, such that an extra shielding cover does not need to be disposed in the embedded electronic device package structure to provide the electronic device with the function of electromagnetic shielding. Therefore, the present invention not only decreases the package volume, simplifies the manufacturing process, but also saves the production cost of the shielding casing.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
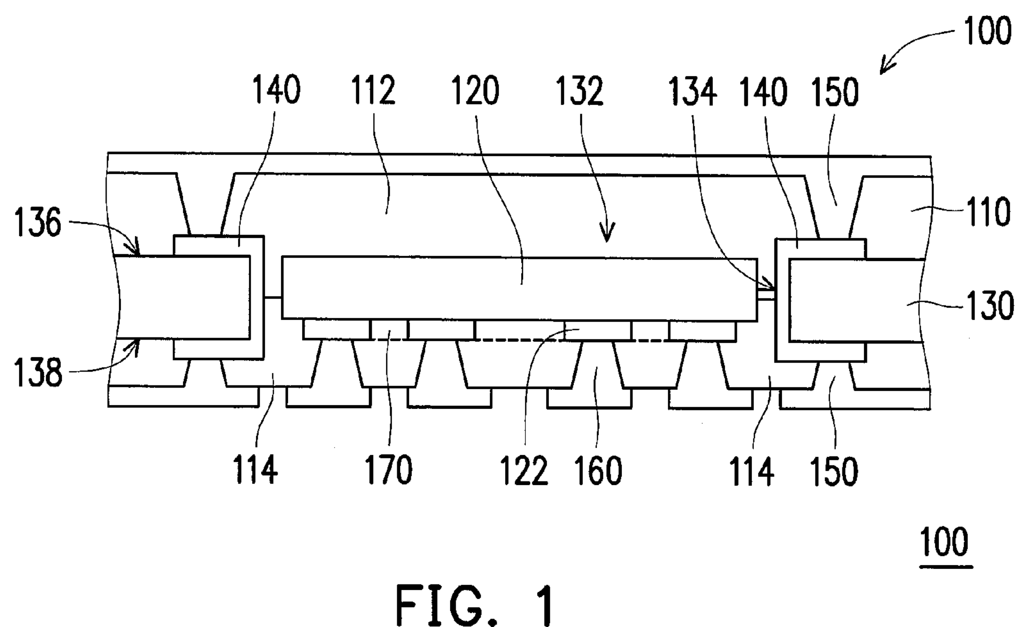
FIG. 1 is a schematic cross-sectional view of an embedded electronic device package structure according to an embodiment of the present invention.
Figure 2:
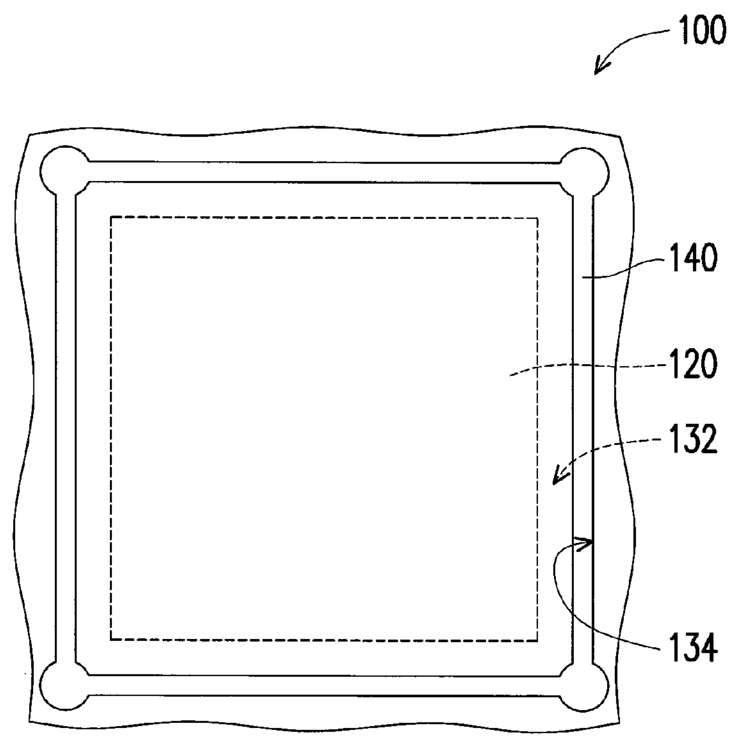
FIG. 2 is a schematic top view of the embedded electronic device package structure in FIG. 1.

FIG. 1 is a schematic cross-sectional view of an embedded electronic device package structure according to an embodiment of the present invention. FIG. 2 is a schematic top view of the embedded electronic device package structure in FIG. 1. Referring to both FIG. 1 and FIG. 2, in the present embodiment, the embedded electronic device package structure 100 includes a core layer 130, an electronic device 120, a first dielectric layer 112, a second dielectric layer 114, a shielding metal layer 140 and a plurality of first conductive vias 150. The core layer 130 includes a first surface 136, a second surface 138 opposite to the first surface 136 and a cavity 132. The electronic device 120 is disposed in the cavity 132. The cavity 132 penetrates through the core layer 130. The method of forming the cavity 132 is, for example, laser drilling, but the present invention is not limited thereto.

To be specific, the embedded electronic device package structure 100 further includes a plurality of second conductive vias 160. The electronic device 120 further includes a plurality of pads 122 facing the second dielectric layer 114. The second conductive vias 160 are extended from the second dielectric layer 114 to the pads 122. The second conductive vias 160 are formed as laser vias by, for example, laser drilling, and then conductive materials are respectively filled in the laser vias by, for example, electroplating, so as to enable the pads 122 of the electronic device 120 to be electrically connected to the second dielectric layer 114. Furthermore, in the present embodiment, the embedded electronic device package structure 100 further includes an adhesive layer 170 filled between the pads 122.

The electronic device 120 is disposed in the cavity 132, and the cavity 132 includes an inner surface 134 facing the electronic device 120. In the present embodiment, the electronic device 120 is, for example, a semiconductor chip. The first dielectric layer 112 and the second dielectric layer 114 are pressed onto the electronic device 120 and the core layer 130 respectively from the top side and the bottom side of the electronic device 120 and the core layer 130, such that the electronic device 120 and the core layer 130 are wrapped in the first dielectric layer 112 and the second dielectric layer 114. The material of the first dielectric layer 112 and the second dielectric layer 114 is, for example, prepreg (PP), but the present invention is not limited thereto.

The shielding metal layer 140 of the present embodiment at least covers the inner surface 132 of the core layer 130. The first conductive vias 150 are respectively disposed on the first dielectric layer 112 and the second dielectric layer 114 and extended respectively from outer surfaces of the first dielectric layer 112 and the second dielectric layer 114 to the shielding metal layer 140. The method of forming the shielding metal layer 140 is, for example, electroplating, but the present invention is not limited thereto. In the present embodiment, the first conductive vias 150 are, for example, laser vias formed by laser drilling. The embedded electronic device package structure 100 further includes a plurality of conductive materials respectively filled in the first conductive vias 150. The conductive materials are filled in the first conductive vias 150 by the method such as electroplating, etc. Thus, the first conductive vias 150 are electrically connected to the shielding metal layer 140 so as to form a path of electrical connection between the first dielectric layer 112 and the second dielectric layer.

In detail, the shielding metal layer 140 is, as shown in FIG. 1, extended from the inner surface 134 to part of the first surface 136 and the second surface 138. The first conductive vias 150 are respectively extended from the first dielectric layer 112 and the second dielectric layer 114 to the shielding metal layer 140 located on the first surface 136 and the second surface 138. Accordingly, the shielding metal layer 140 located on the first surface 136 and the second surface 138 is equivalent to the patterned conductive layer on the core layer 130, so as to extend the range of electrical connection. Thus, the first conductive vias 150 only need to be connected to the shielding metal layer 140 located on the first surface 136 and the second surface 138 to form the electrical connection therewith, and does not need to be aligned precisely with the shielding metal layer 140 covering the inner surface 132, so as to increase the disposing flexibility of the first conductive vias 150 and the tolerance for alignment errors occurred in manufacture processes.

In sum, in the embedded electronic device package structure of the present invention, the electronic device is disposed in the cavity penetrating through the core layer, and the inner surface of the cavity are covered with the shielding metal layer. Also, the conductive vias are configured to connect the shielding metal layer to the outer surfaces of the first dielectric layer and the second dielectric layer. Accordingly, the shielding metal layer connected to the conductive vias not only may be the path of electrical connection, but also provide the electronic device with the function of electromagnetic shielding, and the conductive vias further extend the effect of electromagnetic shielding. Thus, the embedded electronic device package structure of the present invention takes advantage of the existing space and structure in the package structure, such that an extra shielding cover does not need to be disposed in the embedded electronic device package structure to provide the electronic device with the function of electromagnetic shielding. Therefore, the present invention not only decreases the package volume, simplifies the manufacturing process, but also saves the production cost of the shielding casing.

It will be apparent to those skilled in the art that various modifications and variations can be made to the structure of the disclosure without departing from the scope or spirit of the invention. In view of the foregoing, it is intended that the disclosure cover modifications and variations of this invention provided they fall within the scope of the following claims and their equivalents.

What is claimed is:

1. An embedded electronic device package structure, comprising:

a core layer, comprising a first surface, a second surface opposite to the first surface and a cavity, wherein the cavity penetrates through the core layer;

an electronic device, disposed in the cavity, wherein the cavity includes an inner surface facing the electronic device;

a first dielectric layer, disposed on the first surface of the core layer and filled in part of the cavity, the first dielectric layer covering one side of the electronic device;

a second dielectric layer, disposed on the second surface of the core layer, and filled in the rest of the cavity, the second dielectric layer covering another side of the electronic device and jointing the first dielectric layer, wherein the first dielectric layer and the second dielectric layer fully cover the electronic device; and a shielding metal layer, at least covering the inner surface of the cavity; and a plurality of first conductive vias, respectively disposed in the first dielectric layer and the second dielectric layer and extended respectively from outer surfaces of the first dielectric layer and the second dielectric layer to the shielding metal layer.

2. The embedded electronic device package structure as claimed in claim 1, wherein the shielding metal layer are extended from the inner surface to part of the first surface and the second surface, the first conductive vias are respectively extended from the outer surfaces of the first dielectric layer and the second dielectric layer to the shielding metal layer located on the first surface and the second surface.

3. The embedded electronic device package structure as claimed in claim 1, further comprising a plurality of conductive materials, respectively filled in the conductive vias.

4. The embedded electronic device package structure as claimed in claim 1, wherein the first conductive vias comprise laser vias.

5. The embedded electronic device package structure as claimed in claim 1, further comprising a plurality of second conductive vias, the electronic device further comprising a plurality of pads facing the second dielectric layer, and the second conductive vias respectively extended from the second dielectric layer to the pads.

6. The embedded electronic device package structure as claimed in claim 5, further comprising a plurality of conductive materials, respectively filled in the second conductive vias.

7. The embedded electronic device package structure as claimed in claim 5, wherein the second conductive vias comprise laser vias.

8. The embedded electronic device package structure as claimed in claim 5, further comprising an adhesive layer, filled between the pads.

9. The embedded electronic device package structure as claimed in claim 5, wherein the electronic device comprises semiconductor chip.

10. The embedded electronic device package structure as claimed in claim 5, wherein the material of the first dielectric layer and the second dielectric layer comprises prepreg (PP).

* * * * *